(12) United States Patent
Shin et al.

(10) Patent No.: US 9,978,969 B2
(45) Date of Patent: May 22, 2018

(54) DISPLAY DEVICE AND METHOD OF DRIVING THE SAME

(71) Applicant: SAMSUNG DISPLAY CO., LTD., Yongin-si, Gyeonggi-do (KR)

(72) Inventors: Jeong Hwan Shin, Yongin-si (KR); Sung Hwan Kim, Yongin-si (KR); Sung Hoon Bang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/632,607

(22) Filed: Jun. 26, 2017

(65) Prior Publication Data

US 2018/0013085 A1    Jan. 11, 2018

(30) Foreign Application Priority Data

Jul. 7, 2016    (KR) .......................... 10-2016-0086176

(51) Int. Cl.

| | | |
|---|---|---|
| *H03M 1/12* | (2006.01) | |
| *H01L 51/50* | (2006.01) | |
| *G02F 1/1333* | (2006.01) | |
| *G02F 1/295* | (2006.01) | |
| *G02F 1/163* | (2006.01) | |
| *H04N 17/00* | (2006.01) | |
| *H03M 1/00* | (2006.01) | |
| *H04N 9/04* | (2006.01) | |

(52) U.S. Cl.
CPC ........ *H01L 51/50* (2013.01); *G02F 1/133365* (2013.01); *G02F 1/295* (2013.01); *G02F 2001/1635* (2013.01); *G09G 2310/0264* (2013.01); *G09G 2370/08* (2013.01); *H03M 1/00* (2013.01); *H03M 1/12* (2013.01); *H04N 9/045* (2013.01); *H04N 17/002* (2013.01)

(58) Field of Classification Search
CPC ........ H03M 1/00; H03M 1/12; H04N 17/002; H04N 9/045; H04N 3/155
USPC ...... 341/155, 110, 120; 348/222.1, 187, 308
See application file for complete search history.

(56) References Cited

U.S. PATENT DOCUMENTS

2013/0083204 A1\* 4/2013 Solhusvik .............. H04N 5/378
                                                                  348/187
2016/0086539 A1    3/2016 Mizukoshi \* cited by examiner

*Primary Examiner* — Joseph Lauture
(74) *Attorney, Agent, or Firm* — F. Chau & Associates, LLC

(57) ABSTRACT

A display device that may compensate for characteristic deviations among pixels and impact picture quality is provided. The display device includes a plurality of pixels, a plurality of sensing lines connected to the pixels, a sensing circuit configured to extract characteristic information of the pixels through the sensing lines. The sensing circuit includes a plurality of analog-to-digital converters (ADC) to convert the characteristic information into digital sensing data and to output the digital sensing data. A compensating circuit is configured to compare output values of the plurality of ADCs, to set a correction value, and to convert first data into second data based on the sensing data and the correction value. A data driver is configured to generate data signals corresponding to the second data and to output the data signals to the pixels.

18 Claims, 7 Drawing Sheets

DISPLAY DEVICE AND METHOD OF DRIVING THE SAME

CROSS-REFERENCE TO RELATED APPLICATION

This application claims priority to and the benefit of Korean Patent Application No. 10-2016-0086176, filed on Jul. 7, 2016, in the Korean Intellectual Property Office, the entire contents of which are incorporated by reference herein.

1. TECHNICAL FIELD

An embodiment of the present inventive concept relates to a display device and a method of driving the same.

2. DISCUSSION OF THE RELATED ART

A display device such as an organic light emitting display device or a liquid crystal display (LCD) displays an image by using a display panel including a plurality of scan lines and data lines and pixels connected to the scan lines and the data lines. The pixels receive data signals from the data lines in response to scan signals supplied from the scan lines and emit light with brightness corresponding to the data signals.

Displaying an image with uniform picture quality on a display panel can be achieved by having the pixels uniformly emit light corresponding to the data signals. For example, the pixels that receive the data signals having the same voltage should emit light with the same brightness. However, internal elements such as driving transistors and/or organic light emitting diodes (OLED) included in the respective pixels have unique characteristic values in which deviations may exist, and such elements may deteriorate as an amount of use increases so that the characteristic values change. Therefore, characteristic deviations that are generated among the pixels and the characteristic deviations may deteriorate picture quality of the display panel.

SUMMARY

An embodiment of the present inventive concept relates to a display device capable of effectively compensating for deviation in characteristics of pixels and affecting picture quality and a method of driving the same.

A display device according to an embodiment of the present inventive concept includes a plurality of pixels, a plurality of sensing lines respectively connected to groups of the plurality of pixels, a sensing unit (e.g. sensing circuit) configured to extract characteristic information of the plurality of pixels through the sensing lines, the sensing circuit including a plurality of analog-to-digital converters (ADC) configured to convert the characteristic information into digital sensing data and to output the digital sensing data, a compensating unit (e.g. a compensating circuit) configured to compare values of the digital sensing data output by the plurality of ADCs, to set a correction value, and to convert a first data into a second data to be displayed by the display device based on the digital sensing data and the correction value, and a data driver configured to generate data signals corresponding to the second data and to output the data signals to the plurality of pixels.

In an embodiment, the characteristic information of the plurality of pixels extracted by the sensing circuit includes one or more of: threshold voltages, carrier mobilities, deterioration information of driving transistors of the respective pixels or of organic light emitting diodes (OLED) included in the respective pixels.

At least two ADCs among the plurality of ADCs may be commonly connected to at least one sensing line among the sensing lines.

The compensating unit may compare at least two sensing data extracted through the at least one sensing line and converted by the at least two ADCs and set the correction value in response to a comparison result.

A kth (k is a natural number) ADC among the plurality of ADCs may be connected to a dummy channel connected to at least one sensing line among sensing lines connected to a (k+1)th ADC.

The dummy channel may include an analog front end (AFE) connected between the at least one sensing line connected to the (k+1)th ADC and the kth ADC and a switching element connected between the AFE and the kth ADC.

The display device may further include at least one switching element connected between the at least one sensing line commonly connected to the kth ADC and the (k+1)th ADC and the dummy channel.

The kth ADC may be further connected to a plurality of sensing channels comprising a plurality of AFEs respectively connected to a plurality of sensing lines assigned to a sensing integrated circuit (IC) including the kth ADC and a plurality of switching elements connected between the AFEs and the kth ADC.

The compensating unit may include a compensating value setting unit configured to set a compensation value for each of the pixels by using the sensing data and the correction value and a data converting unit configured to convert the first data into the second data by using the compensation value.

When at least some of the plurality of ADCs convert a same first voltage into different digital codes, the correction value may be set to compensate for output deviations among the ADCs for the first voltage.

A method of driving the display device in a sensing period and a driving period according to an embodiment of the present inventive concept may include extracting, during a sensing period, characteristic information of pixels through sensing lines, converting the characteristic information into digital sensing data, and setting a compensation value to compensate for characteristic deviations among the pixels based on the digital sensing data; and converting, during a driving period, a first data input from an external source into a second data by using the compensation value, and generating data signals corresponding to the second data. The setting of the compensation value may include setting a correction value by comparing values of the digital sensing data output by of a plurality of ADCs connected to the sensing lines, and setting the compensation value based on the correction value.

The setting of the correction value may include comparing output values of a kth (k is a natural number) ADC and a (k+1)th ADC among the plurality of ADCs and setting a correction value for the output value of the (k+1)th ADC so that the output value of the (k+1)th ADC is corrected in accordance with an output value of the kth ADC.

In the setting of the correction value, the comparing of the output value of the kth ADC with the output value of the (k+1)th ADC may be repeatedly performed while increasing a value k until a correction value for output values of remaining ADCs is set in accordance with an output value of a first ADC among the plurality of ADCs.

The correction value may be set to compensate for output deviations for a first voltage among the ADCs in the sensing circuit when at least some of the plurality of ADCs convert the same first voltage into different digital codes.

The setting of the correction value may be performed in a predetermined period assigned to the sensing period every sensing period.

The setting of the correction value may be performed in a predetermined sensing period or whenever a selection signal of a user is input.

The setting of the correction value may include commonly connecting at least one sensing line among the sensing lines to at least two ADCs, extracting characteristic information of pixels connected to the sensing line through the at least one sensing line and supplying the extracted characteristic information to the at least two ADCs, and comparing the sensing data output from the at least two ADCs in response to the characteristic information of the pixels connected to the sensing line and setting the correction value in response to the comparison result.

In an embodiment, a display device includes: a display panel; a plurality of pixels arranged within the display panel, a plurality of scan lines and a plurality of data lines connected to the plurality of pixels, a sensing circuit configured to extract characteristic information of the pixels, the sensing circuit including a plurality of analog-to-digital converts (ADC) to convert the characteristic information into digital sensing data; a compensating circuit configured to compare digital sensing values of the plurality of ADCs, to set a correction value, and convert a first data into a second data based on the digital sensing values and the correction value. At least some of the plurality of data lines are connected to the sensing circuit by which the sensing circuit extracts the characteristic information of the pixels during a predetermined sensing period, and a data driver is configured to generate data signals corresponding to the second data and output the data signals to the pixels during a driving period.

In an embodiment, each of the plurality of pixels include a driving transistor and an organic light emitting diode (OLED) connected to the driving transistor, and wherein the driving transistor controls a driving current that flows from a first pixel power node to a second pixel power node via the OLED in response to the data signals corresponding to the second data.

In the display device according to the embodiment of the present inventive concept and the method of driving the same, the deviation in the characteristics of the pixels may be effectively compensated for. By compensating for the deviation in the pixels, an image with more uniform picture quality may be displayed on the display panel.

BRIEF DESCRIPTION OF THE DRAWINGS

Exemplary embodiments of the inventive concept will now be described more fully hereinafter with reference to the accompanying drawings; however, the inventive concept may be embodied in various forms and is not limited to the embodiments set forth herein. Rather, these embodiments are provided so to enhance the understanding of those skilled in the art.

In the drawing figures, dimensions may be exaggerated for clarity of illustration. It will be understood that when an element is referred to as being "between" two other elements, there may be only the element between the two other elements, or one or more intervening elements may also be present. Like reference numerals refer to like elements throughout.

DETAILED DESCRIPTION

Figure 1:
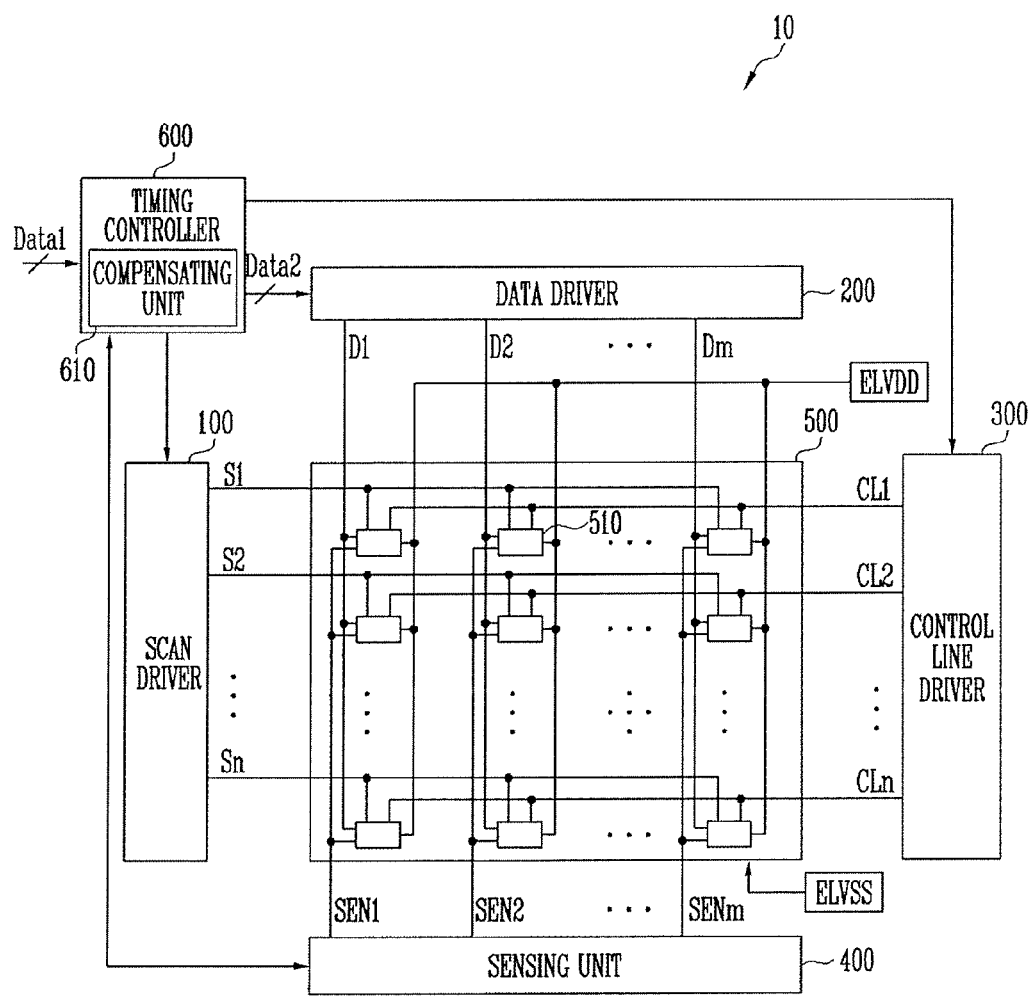
FIG. 1 illustrates a display device according to an embodiment of the present inventive concept.

Example embodiments will now be described more fully hereinafter with reference to the accompanying drawings; however, they inventive concept may be embodied in different forms and should not be construed as limited to the embodiments set forth herein. In the accompanying drawings, elements irrelevant to description of the present inventive concept may be omitted for clarity. In the drawing figures, dimensions may be exaggerated for clarity of illustration. Like reference numerals refer to like elements throughout.

FIG. 1 illustrates a display device 10 according to an embodiment of the present inventive concept. In FIG. 1, for convenience sake, the display device is shown an organic light emitting display device. However, the present inventive concept is not limited thereto.

Referring to FIG. 1, the display device according to the embodiment of the present inventive concept may include a scan driver 100, a data driver 200, a control line driver 300, a sensing unit (e.g. sensing circuit) 400, a display panel 500, and a timing controller 600. Although in FIG. 1 the display panel 500 is illustrated as being arranged separate from a driving circuit such as the scan driver 100, the present inventive concept is not limited thereto. For example, at least one of the scan driver 100, the data driver 200, the control line driver 300, and the sensing circuit 400 may be integrated with the display panel 500.

According to the embodiment, the display device may be driven during a sensing period and a driving period. During the sensing period, at least one of characteristic information of respective pixels 510 that form the display panel 500, for example, threshold voltages, mobilities, and/or deterioration information of driving transistors and/or organic light emitting diodes (OLED) included in the respective pixels 510 may be extracted. In the driving period, a predetermined image may be displayed in response to input data.

The scan driver 100 supplies scan signals to the pixels 510 via scan lines S1 through Sn during the sensing period and the driving period in response to receiving control signals from the timing controller 600. For example, the scan driver 100 may sequentially supply the scan signals to the scan lines S1 through Sn during the sensing period and the driving period. According to another embodiment, the scan driver 100 may supply the scan signals to the scan lines S1 through Sn only during the driving period. The pixels 510 that receive the scan signals are electrically connected to data lines D1 through Dm. For this purpose, the scan signals may be set to have gate on voltages at which transistors included in the pixels 510 may be turned on.

The data driver 200 supplies data signals to the data lines D1 through Dm during the driving period in response to the control of the timing controller 600. According to the embodiment, the data driver 200 generates the data signals in response to a second data Data2 received from the timing controller 600 during the driving period. The second data Data2 may include a value based on the first data Data1 input to the timing controller 600 from the outside (e.g. an external input) corresponding to an image to be displayed on the display panel 500. More particularly, the value may be obtained by changing the first data Data1 and may compensate for a deviation in characteristics of the pixels 510. The data signals generated by the data driver 200 are supplied to the data lines D1 through Dm. The data signals supplied to the data lines D1 through Dm are supplied to the pixels 510 selected by the scan signals. The pixels 510 selected by the scan signals will emit light with brightness corresponding to the data signals in the driving period so that the image is displayed on the display panel 500.

According to the embodiment of the inventive concept, the data driver 200 may supply a reference voltage to the data lines D1 through Dm during the sensing period in response to the control of the timing controller 600. For example, the reference voltage may be set as a predetermined voltage at which currents may flow through the driving transistors included in the pixels 510.

However, according to another embodiment of the inventive concept, the data driver 200 may not supply the reference voltage to the pixels 510 during the sensing period. For example, when the pixels 510 are connected to another voltage source and/or current source during the sensing period, the data driver 200 may drive the data lines D1 through Dm only in the driving period and the data driver 200 may not supply any reference voltages during the sensing period.

With continued reference to FIG. 1, the control line driver 300 supplies control signals to control lines CL1 through CLn during the sensing period by the control of the timing controller 600. For example, the control line driver 300 may sequentially supply the control signals to the control lines CL1 through CLn during the sensing period. According to the embodiment, the control signals may be set as gate on voltages having a level at which the transistors included in the pixels 510 may be turned on. Therefore, the pixels 510 that receive the control signals may be electrically connected to sensing lines SEN1 through SENm.

According to another embodiment, the control line driver 300 may not be provided, and the scan driver 100 may supply the control signals to the control lines CL1 through CLn instead of the control line driver 300. Alternatively, instead of forming the control lines CL1 through CLn as shown in FIG. 1, a connection between the pixels 510 and the sensing lines SEN1 through SENm may be controlled by using the scan lines S1 through Sn during the sensing period.

The sensing circuit 400 shown in FIG. 1, may include integrated circuitry configured to sense characteristic information from the pixels 510 received through the sensing lines SEN1 through SENm during the sensing period in response to the control of the timing controller 600. However, according to another embodiment, the sensing lines SEN1 through SENm may be omitted. When the sensing lines are omitted, the sensing circuit 400 may sense the characteristic information from the pixels 510 through the data lines D1 through Dm. For example, when the sensing lines SEN1 through SENm are not provided, the data lines D1 through Dm may be connected to the sensing circuit 400 during the sensing period and may be used as the sensing lines, thus providing a more compact structure.

Figure 3:
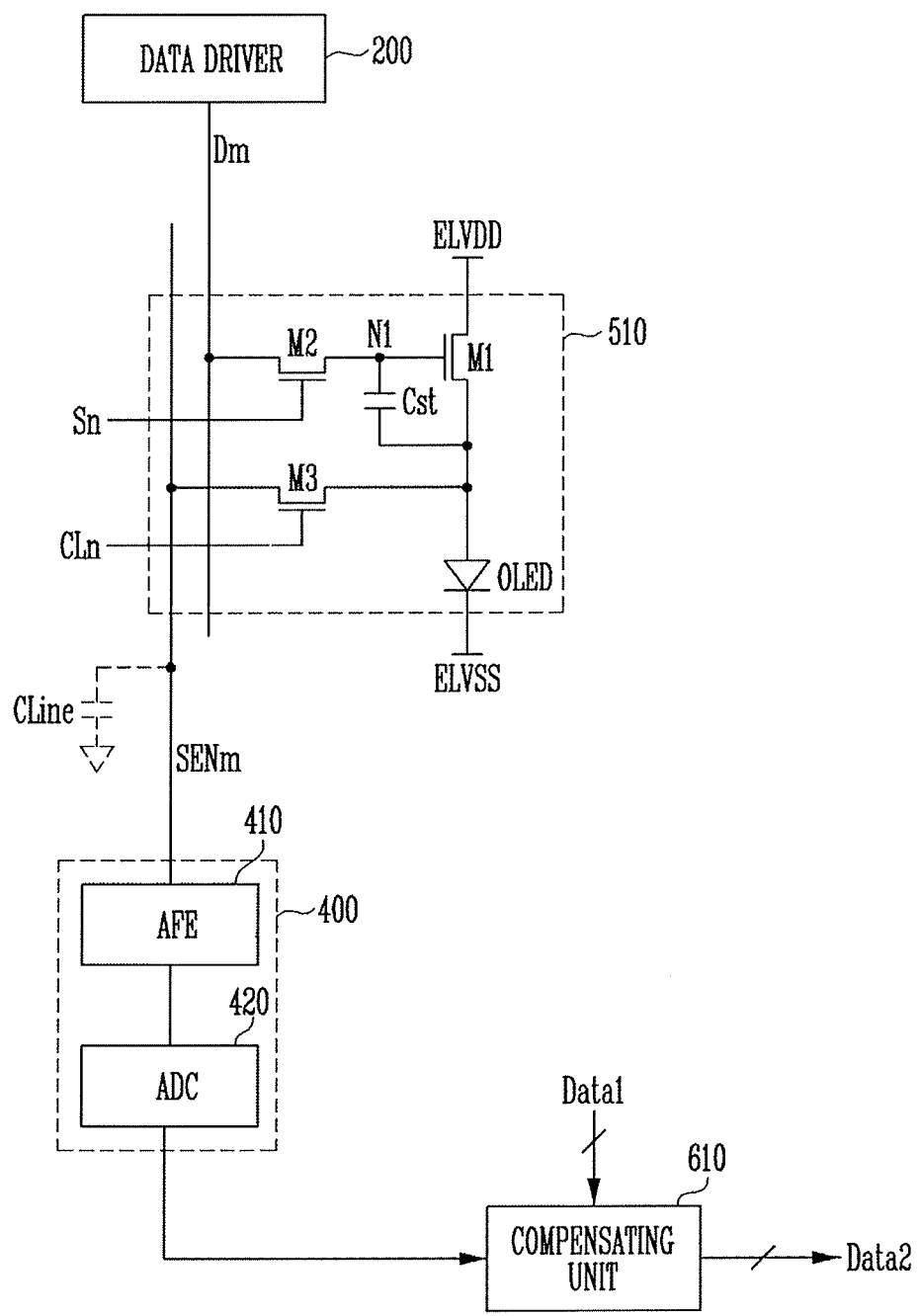
FIG. 3 illustrates an embodiment of a channel provided in the sensing circuit of FIG. 1.

The sensing circuit 400 converts the sensed characteristic information into digital sensing data and outputs the digital sensing data. The sensing circuit 400 includes at least one analog-to-digital converter (ADC) 420 (FIG. 3). The sensing data output from the sensing circuit 400 is stored in a memory (not shown) by the timing controller 600, etc. The stored sensing data may be used for converting the first data Data1 into the second data Data2 and may compensate for the deviation in the characteristics of the pixels 510. For this purpose, in the sensing period, the sensing data corresponding to all the pixels 510 included in the display 500 may be stored in the memory. In addition, according to the present embodiment, the sensing circuit 400 may output comparison data including characteristic information of the outputs of the ADC in the form of digital data to the timing controller 600, etc.

The display panel 500 may include, for example, the plurality of scan lines S1 through Sn, data lines D1 through Dm, and sensing lines SEN1 through SENm and the plurality of pixels 510 connected and/or coupled to the scan lines S1 through Sn, data lines D1 through Dm, and sensing lines SEN1 through SENm. According to the embodiment, when the display panel 500 is constructed to include an organic light emitting display device, the display panel 500 receives first and second pixel powers ELVDD and ELVSS.

With further regard to the display panel 500, each of the pixels 510 includes a driving transistor (not shown). In addition, when the pixels 510 are pixels of an organic light emitting display panel, each pixel 510 may further include an organic light emitting diode (OLED) connected to the driving transistor.

The driving transistor controls a driving current that flows from the first pixel power ELVDD to the second pixel power ELVSS via the OLED in response to a data signal. Then, the OLED emits light with a brightness corresponding to the driving current. When the data signal corresponding to a brightness associated with black is supplied, the driving transistor stops the driving current from flowing to the OLED, so that the OLED does not emit light.

With continued reference to FIG. 1, the timing controller 600 controls, for example, driving of the scan driver 100, the data driver 200, the control line driver 300, and the sensing circuit 400. In addition, the timing controller 600 stores sensing data from the sensing circuit 400 in the memory and converts the externally input first data Data1 by using the stored sensing data to generate the second data Data2. The generated second data Data2 may be output to the data driver 200. According to the embodiment, the first data Data1, the second data Data2, and the sensing data may be digital signals. For example, the timing controller 600 may change a bit value of the first data Data1 by using the sensing data and may output the changed bit value as the second data Data2.

In addition, according to the embodiment of the present inventive concept, the timing controller 600 may convert the first data Data1 into the second data Data2 by reflecting a correction value (for example, an ADC correction value or a sensing integrated circuit (IC) correction value) for compensating for characteristic deviation of the sensing circuit 400 together with the sensing data. Therefore, the compensation for characteristic deviations among the pixels 510 may be made.

The timing controller 600 according to the embodiment of the present inventive concept may include a compensating unit 610 to compensate for characteristic deviations among the pixels. However, the present inventive concept is not limited thereto. For example, the compensating unit 610 may be provided outside (e.g. separate from) the timing controller 600 and may generate the second data Data2 by converting the first data Data1.

The compensating unit 610 may include integrated circuitry configured to receive the first data Data1 and the sensing data and generates the second data Data2 in response to the first data Data1 and sensing data. In addition, according to the embodiment of the present inventive concept, the plurality of ADCs may be included in the sensing circuit 400 and the compensating unit 610 may be configured to compare output values of the ADCs and may set a correction value.

According to the embodiment, the correction value may be used to correct for output deviation of the sensing circuit by one more ADCs that received a same first analog voltage input. For example, the correction value may be used for changing a value output from a particular ADC when the plurality of ADCs convert the same first analog voltage into different digital codes. For example, the correction value may be set so that output deviations among the ADCs receiving the first analog voltage are compensated for when at least some of the plurality of ADCs convert the first analog voltage into different digital codes. In addition, when the plurality of ADCs convert a plurality of analog voltages into different digital codes, a correction value for each of the plurality of analog voltages may be set.

The compensating unit 610 may convert the first data Data1 into the second data Data2 based on the sensing data and the correction value. For example, the compensating unit 610 may generate the second data Data2 by changing the bit value of the first data Data1 externally input by using the sensing data and the correction value. In this case, the second data Data2 may be set to compensate for the characteristic deviations among the pixels 510 and output deviations among the plurality of ADCs.

The second data Data2 generated by the compensating unit 610 is output to the data driver 200. In response to receiving the second data Data2, the data driver 200 may generate the data signals corresponding to the second data Data2 and output the generated data signals to the pixels 510 through the data lines D1 through Dm.

Figure 2A:
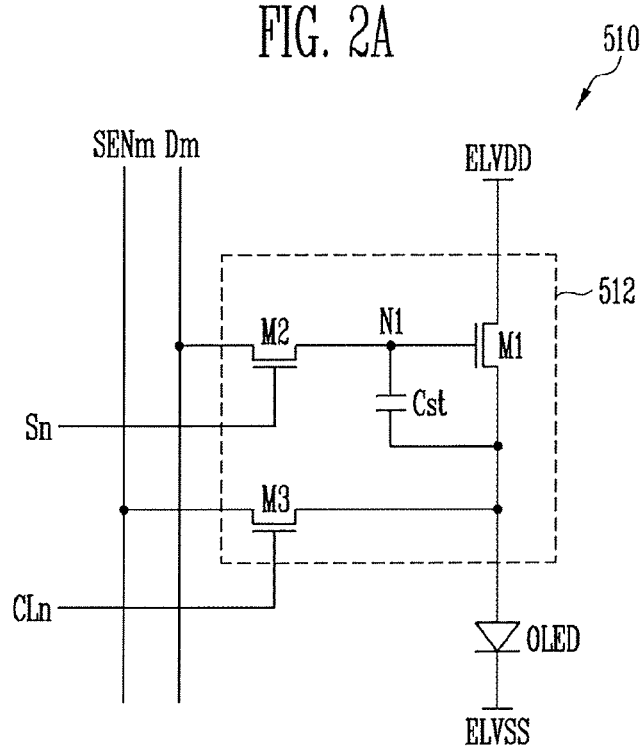
FIGS. 2A and 2B respectively illustrate an embodiment of the pixel of FIG. 1.
Figure 2B:
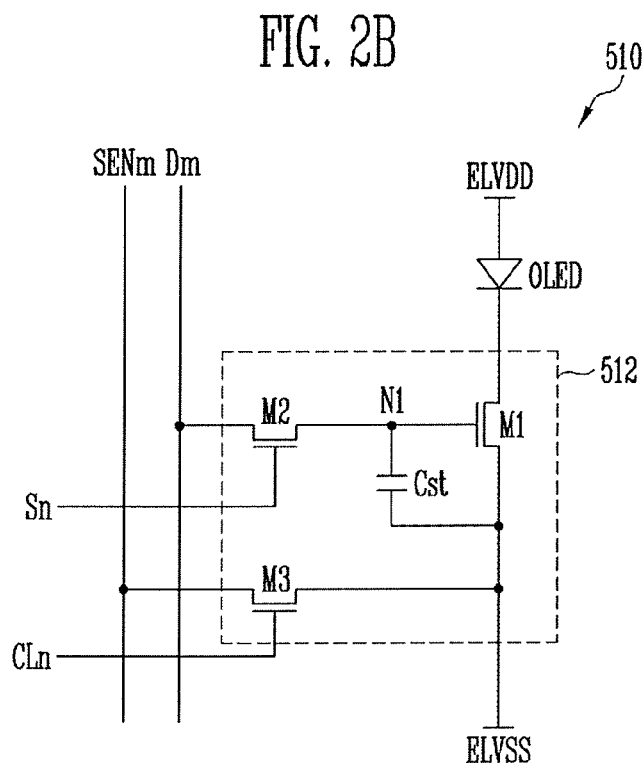

FIGS. 2A and 2B respectively illustrate an embodiment of a pixel 510 such as shown in FIG. 1. For convenience sake, in FIGS. 2A and 2B, the pixel connected to the nth (n is a natural number) scan line Sn and the mth (m is a natural number) data line Dm is illustrated.

Referring to FIG. 2A, the pixel 510 according to the embodiment of the present inventive concept includes an OLED and a pixel circuit 512.

A first electrode (for example, an anode electrode) of the OLED is connected to the pixel circuit 512 and a second electrode (for example, a cathode electrode) thereof is connected to the second pixel power ELVSS. The OLED emits light with a brightness corresponding to a driving current when the driving current is supplied from the pixel circuit 512.

The pixel circuit 512 controls the driving current that flows from the first pixel power ELVDD to the second pixel power ELVSS via the OLED in response to a data signal. For this purpose, the pixel circuit 512 includes a first transistor M1 (a driving transistor), a second transistor M2 (a switching transistor), a third transistor M3 (a sensing control transistor), and a storage capacitor Cst. According to an embodiment, at least the first transistor M1 may comprise an oxide semiconductor thin film transistor (TFT) including an active layer formed of an amorphous or crystalline oxide semiconductor. For example, the first through third transistors M1 through M3 may be oxide semiconductor TFTs. The oxide semiconductor TFT has a high off current characteristic. According to another embodiment, at least one of the first through third transistors M1 through M3 may comprise a low temperature poly-silicon (LTPS) TFT including an active layer formed of poly-silicon. The LTPS TFT has high electron mobility and a high-speed driving characteristic.

As shown in FIG. 2A, a first electrode of the first transistor M1 is connected to the first pixel power ELVDD and a second electrode thereof is connected to the first electrode of the OLED. A gate electrode of the first transistor M1 is connected to a first node N1. The first transistor M1 controls an amount of the driving current that flows from the first pixel power ELVDD to the second pixel power ELVSS via the OLED in response to a voltage of the first node N1.

In addition, with regard to the second transistor M2, a first electrode of the second transistor M2 is connected to the data line Dm and a second electrode thereof is connected to the first node N1. A gate electrode of the second transistor M2 is connected to the scan line Sn. The second transistor M2 is turned on when a scan signal is supplied to the scan line Sn and electrically connects the data line Dm and the first node N1.

With regard to the third transistor M3 shown in FIG. 2A, a first electrode of the third transistor M3 is connected to the second electrode of the first transistor M1 and a second electrode thereof is connected to the sensing line SENm. A gate electrode of the third transistor M3 is connected to the control line CLn. In another embodiment in which the control line CLn is omitted, the gate electrode of the third transistor M3 may be connected to the scan line Sn. The third transistor M3 is turned on by the control signal supplied to the control line CLn in the sensing period and electrically connects the sensing line SENm and the second electrode of the first transistor M1.

The storage capacitor Cst is connected between the first node N1 and the second electrode of the first transistor M1. The storage capacitor Cst stores the voltage of the first node N1.

According to the present inventive concept, a circuit structure of the pixel 510 is not limited to the circuit structure shown in FIG. 2A.

For example, according to another embodiment of the present inventive concept, the OLED may be provided between the first pixel power ELVDD and the first transistor M1 as illustrated in FIG. 2B. For example, according to the present inventive concept, the pixel 510 may include the third transistor M3 for sensing the characteristic information of the pixel 510 in the sensing period and the circuit structure of the pixel 510 may vary.

Brightness of the above-described pixel 510 is determined in accordance with the data signal. Characteristic values of the first transistor M1 and/or the OLED may additionally affect the brightness of the pixel 510. In addition, the characteristic values of the first transistor M1 and/or the OLED may change in accordance with an amount of use over time.

Therefore, according to the present inventive concept, an external compensation method in which the characteristic information of the pixel 510 is sensed in a predetermined sensing period and input data, for example, the first data Data1, may be changed based on applying the sensed characteristic information of the pixel 510. Therefore, an image with uniform picture quality may be displayed.

More specifically, in an embodiment the pixel 510 outputs the characteristic information through the sensing line SENm during the predetermined sensing period and may be driven in response to the data signal supplied from the data line Dm during the driving period. According to the embodiment of the inventive concept, a process of sensing the characteristic information of the pixel 510 may be performed at least once before forwarding the characteristic information on to the compensating unit of the display device. Therefore, the characteristic deviations among the pixels 510 provided in the display panel 500 may be compensated for by previously storing the initial characteristic of the pixel 510 and correcting the input data based on the initial characteristic information. Therefore, an image with uniform picture quality may be displayed on the display panel 500.

In addition, according to the embodiment of the inventive concept, the operation of sensing the characteristic information of the pixel 510 may be performed for every predetermined sensing period after the display device is actually used. As the characteristic information may change over time, and due to ambient conditions that could be different from when the initial characteristics were stored, the compensation of the pixel characteristics, such as in real time, may provide an increased uniformity in picture quality. Therefore, in this embodiment, although the characteristic deviations among the pixels 510 may be additionally generated in accordance with an amount of use, the changed characteristic information of the pixels 510 are also being updated in real time and the updated characteristic information may be reflected in the generation of the data signals. Therefore, an image with uniform picture quality may be continuously displayed on the display panel 500.

FIG. 3 illustrates an embodiment of a channel provided in the sensing circuit of FIG. 1. FIG. 3 shows only one channel of the sensing circuit connected to the pixel of FIG. 2A for clarity. However, a plurality of channels respectively connected to the sensing lines may be provided in the sensing circuit.

Referring to FIG. 3, the sensing circuit 400 according to the embodiment of the present inventive concept includes the plurality of channels respectively connected to the sensing lines SEN1 through SENm and an analog front end (AFE) 410 is provided at an input end of each of the channels. In addition, the sensing circuit 400 further includes at least one ADC 420 connected to the AFE 410 of each of the channels.

The AFE 410 temporarily stores the characteristic information of the pixel 510 input from the corresponding sensing line SENm in the sensing circuit 400. For this purpose, the AFE 410 may include, for example, a capacitor (not shown) connected to the corresponding sensing line SENm.

The ADC 420 converts the analog characteristic information of the pixel 510 input via the AFE 410 of each of the channels into digital sensing data and outputs the digital sensing data to the compensating unit 610.

The compensating unit 610 is configured to convert the received first data Data1 into the second data Data2, so that the characteristic deviations among the pixels 510 are compensated for based on the sensing data including the characteristic information of the pixels 510. The compensating unit 610 also outputs the second data Data2. In addition, according to the embodiment of the present inventive concept, the compensating unit 610 converts the first data Data1 into the second data Data2 by additionally reflecting (e.g. utilizing) the correction value, which will be described in more detail. The second data Data2 generated by the compensating unit 610 is input to the data driver 200 and the data driver 200 generates the data signal corresponding to the second data Data2.

Hereinafter, operations of the pixels 510 and the sensing circuit 400 in the sensing period and the driving period will be described in detail with reference to FIGS. 1 through 3.

According to the embodiment of the inventive concept, during the sensing period, the sensing circuit 400 extracts the characteristic information of the pixels 510 through the sensing lines SEN1 through SENm and converts the extracted characteristic information into the sensing data. The compensating unit 610 sets a compensation value so that the characteristic deviations among the pixels 510 may be compensated for in response to the sensing data.

More specifically, during the sensing period, the data driver 200 supplies the reference voltage at which the currents may flow through the pixels 510 to the data lines D1 through Dm. According to another embodiment, the data driver 200 may not supply the reference voltage. In this case, the pixels 510 may be driven by electrically connecting the data lines D1 through Dm to predetermined current sources and/or voltage sources during the sensing period.

In addition, during a predetermined portion of the sensing period, the scan signals and the control signals are respectively supplied to the scan lines S1 through Sn and the control lines CL1 through CLn. According to the embodiment, the scan signals and the control signals may be sequentially supplied to horizontal lines of the display panel 500.

In the pixels 510 on the horizontal lines that receive the scan signal and the control signal, second transistors M2 and third transistors M3 of the respective pixels are turned on. When the third transistors M3 are turned on, second electrodes of the first transistors M1 are electrically connected to the sensing lines SEN1 through SENm. When the second transistors M2 are turned on, the reference voltage from the data lines D1 through Dm is transmitted to the first node N1.

When the reference voltage is supplied to the first node N1, the first transistors M1 are turned on. Therefore, currents corresponding to the reference voltage are generated by the pixels 510 on the corresponding horizontal lines and the currents are supplied to the sensing lines SEN1 through SENm via the third transistors M3 of the pixels 510.

The sensing lines SEN1 through SENm have predetermined resistance values so that voltages corresponding to predetermined currents that flow through the corresponding pixels 510 are applied to the sensing lines SEN1 through SENm. The voltages applied to the sensing lines SEN1 through SENm are stored in line capacitors CLine parasitically formed in the sensing lines SEN1 through SENm and are stored in the AFEs 410 respectively connected to the sensing lines SEN1 through SENm.

With continued reference to FIGS. 1 to 3, the voltages stored in the sensing lines SEN1 through SENm and the AFEs 410 include the characteristic information of the first transistors M1 included in the pixels 510 on the currently sensed horizontal line. Specifically, the currents that flow through the first transistors M1 in response to the reference voltage may be set to vary in the pixels 510 in response to threshold voltages, mobilities, and/or deteriorations of the first transistors M1. Therefore, although the same reference voltage is supplied to the data lines D1 through Dm respectively connected to the pixels 510, different voltages may be stored in the sensing lines SEN1 through SENm and the AFEs 410. Therefore, the characteristic deviations among the pixels 510 may be extracted by extracting a deviation in the voltages.

In FIG. 3, an operation of extracting the characteristic information of the first transistors M is described. However, according to the embodiment, characteristic information of the OLEDs may be additionally extracted. For example, the OLEDs respectively provided in the pixels 510 on the corresponding horizontal line are connected to the predetermined current source(s) so that the currents may flow through the OLEDs. The characteristic information corresponding to threshold voltages and deteriorations of the OLEDs may be additionally extracted by extracting the voltage applied to one electrode of each of the OLEDs.

A person of ordinary skill in the art should understand that a method of extracting the characteristic information of the pixels 510 is not limited to the embodiment of FIG. 3. For example, in another embodiment, the characteristic information of the pixels 510 may be extracted by various methods that would permit a compensation of the characteristic deviation among the pixels.

When the voltages applied to the sensing lines SEN1 through SENm are input to the sensing circuit 400 through the AFEs 410, the ADCs 420 convert the analog voltages stored in the AFEs 410 into the digital sensing data. The sensing data output from the ADCs 420 is input to the compensating unit 610 so that a compensation of the deviations in characteristics of the pixels may occur. Although not illustrated in FIG. 3, transmission ends for transmitting the sensing data from the ADCs 420 to the compensating unit 610 may be additionally provided at output ends of the ADCs 420.

The compensating unit 610 that receives the sensing data corresponding to the pixels 510 sets the compensation value corresponding to the sensing data of the pixels 510. The compensating unit 610 converts the first data Data1 into the second data Data2 during the driving period based on the compensation value set in the sensing period and outputs the second data Data2 to the data driver 200. In particular, the compensating unit 610 converts the first data Data1 so that the characteristic deviations among the pixels 510 may be compensated for and generates the second data Data2.

During the driving period, the second data Data2 output from the compensating unit 610 is input to the data driver 200. The data driver 200 then generates the data signals corresponding to the second data Data2 and outputs the generated data signals to the data lines D1 through Dm.

In addition, the scan signals are supplied to the scan lines S1 through Sn during the driving period. The scan signals may be sequentially supplied to horizontal lines of the display panel 500.

With regard to the pixels 510 that receive the scan signals, the second transistors M2 are turned on. Therefore, the data signals applied to the data lines D1 through Dm are transmitted to the first nodes N1 of the corresponding pixels 510. Therefore, the voltages corresponding to the data signals are stored in the storage capacitors Cst. The data signals corresponding to the brightness (excluding black) are set to have voltages at which the first transistors M1 may be turned on. Therefore, when the data signals with the brightness excluding black are supplied to the first nodes N1, the first transistors M1 are turned on. The first transistors, M1, after being turned on, supply the driving currents corresponding to the data signals to the OLEDs. Therefore, the driving currents flow along current paths from the first pixel power ELVDD to the second pixel power ELVSS via the first transistors M1 and the OLEDs. Then, the OLEDs emit light with brightness corresponding to the driving currents.

According to the above-described embodiment, the data signals are generated in response to the second data Data2. Therefore, the characteristic deviations among the pixels 510 are compensated for, so that an image with uniform picture quality may be displayed on the display panel 500.

In the channels of the sensing circuit 400 connected to the pixels 510 of at least one vertical line, the AFEs 410 store the characteristic information extracted from the pixels 510 on the corresponding vertical line are respectively provided and the ADCs 420 converts the analog characteristic information stored in the AFEs 410 into the digital sensing data that are provided at the output ends of the AFEs 410.

According to an embodiment, the plurality of AFEs 410 may share the one ADC 420. In this case, a switching unit (not shown) may be provided between the plurality of AFEs 410 and the one ADC 420. For example, the switching unit sequentially connects the plurality of AFEs 410 to the one ADC 420 so that the characteristic information stored in the respective AFEs 410 is sequentially supplied to the ADC 420 and may be converted into the sensing data. However, other configurations are within the scope of the inventive concept, as there can be a plurality of ADCs.

A large number of data lines D1 through Dm may be provided on the display panel 500. Therefore, the sensing circuit 400 includes a large number of channels respectively connected to the data lines D1 through Dm. Therefore, although at least some of the plurality of AFEs 410 share the one ADC 420, the plurality of ADCs 420 may be provided in the sensing circuit 400.

The ADCs 420 convert the analog characteristic information input from the AFEs 410 of assigned channels into digital sensing data and output the digital sensing data to the compensating unit 610. The compensating unit 610 stores the characteristic information of the pixels 510 by aggregating the sensing data input from the plurality of ADCs 420 and converts the first data Data1 into the second data Data2 in response to receiving the characteristic information.

When the plurality of ADCs 420 is included in the sensing circuit 400, there may be output deviations among the ADCs 420, which may result in the characteristic information of the pixels 510 being non-uniformly converted. For example, due to the output deviations among the ADCs 420, the same input voltage may be converted into different digital codes. Therefore, according to the present inventive concept, the correction value is set by comparing the output values of the ADCs 420 and the first data Data1 is converted into the second data Data2 based on the correction value together with the sensing data.

For example, according to the embodiment of the present inventive concept, the correction value is set by comparing the output values of the plurality of ADCs 420 connected to the sensing lines SEN1 through SENm and the compensation value is set so that the characteristic deviations among the pixels 510 are compensated for based on the correction value. With two possible sources of deviation (pixels themselves and ADCs of the sensing circuit), the second data Data2 may be generated to compensate for both the characteristic deviations among the pixels 510 and the output deviations generated in the sensing circuit 400 for sensing the characteristic deviations. Therefore, the characteristic deviations among the pixels 510 may be effectively compensated for, and an image with more uniform picture quality may result.

Figure 4A:
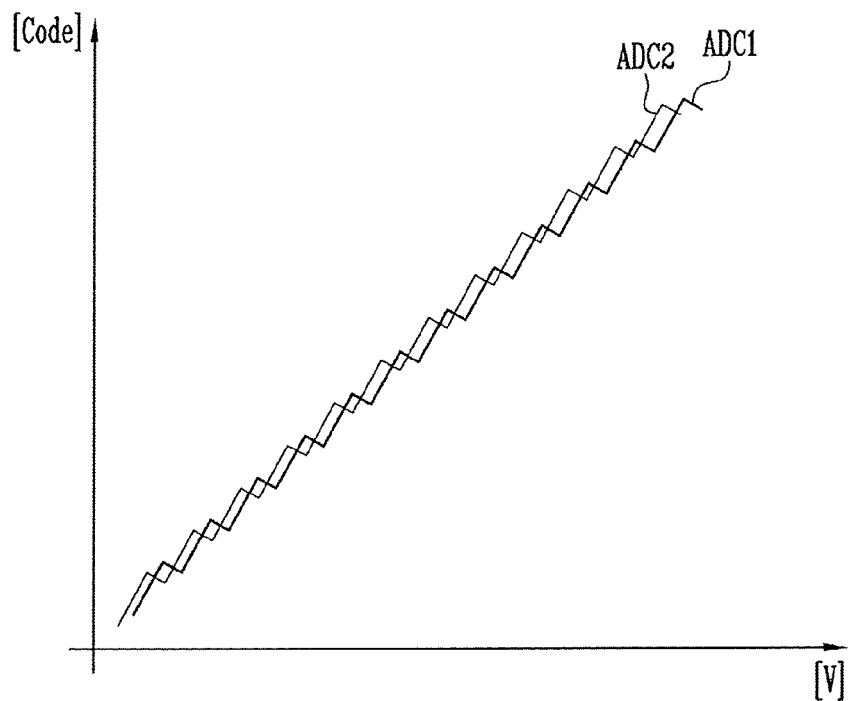
FIGS. 4A and 4B illustrate deviation in outputs of different analog-to-digital converters (ADC)
Figure 4B:
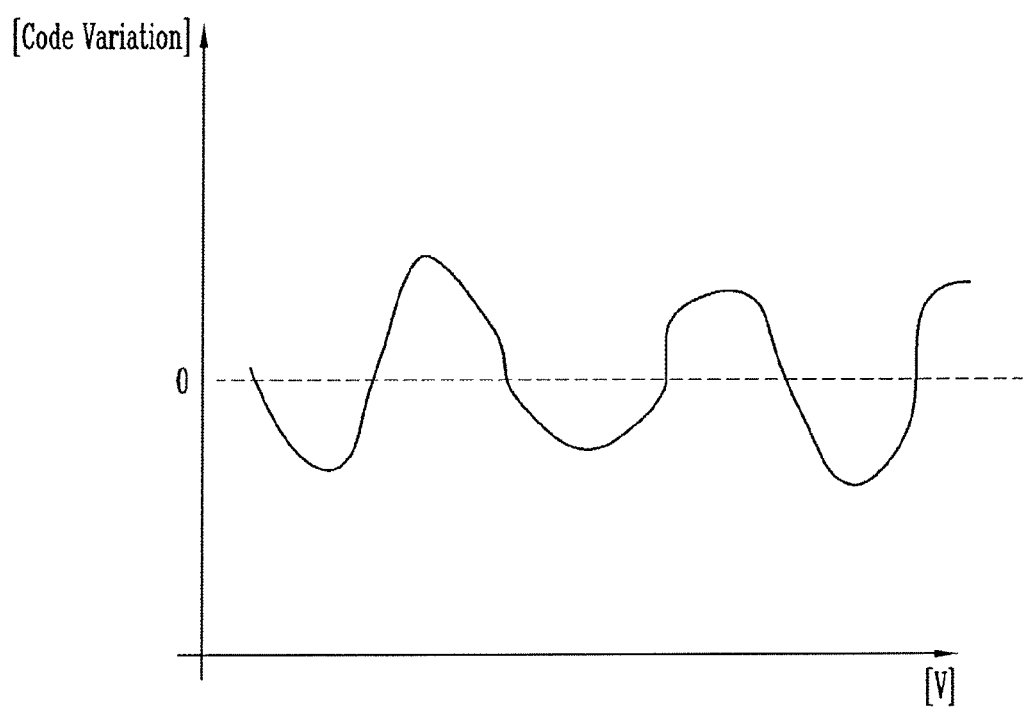

FIGS. 4A and 4B illustrate the output deviations among the ADCs included in the sensing circuit. For example, in FIGS. 4A and 4B, output deviation between two ADCs, for example, a first ADC and a second ADC is illustrated.

Referring to FIGS. 4A and 4B, the first ADC ADC1 and the second ADC ADC2 may have different linearity characteristics. Therefore, when the same voltage, for example, a first voltage is input to the first ADC ADC1 and the second ADC ADC2, the first ADC ADC1 and the second ADC ADC2 may convert the first voltage into different codes. Thus, the compensation for characteristic differences of one or more of the ADCs may result in a conversion of the voltage into codes that have fewer differences.

Figure 5:
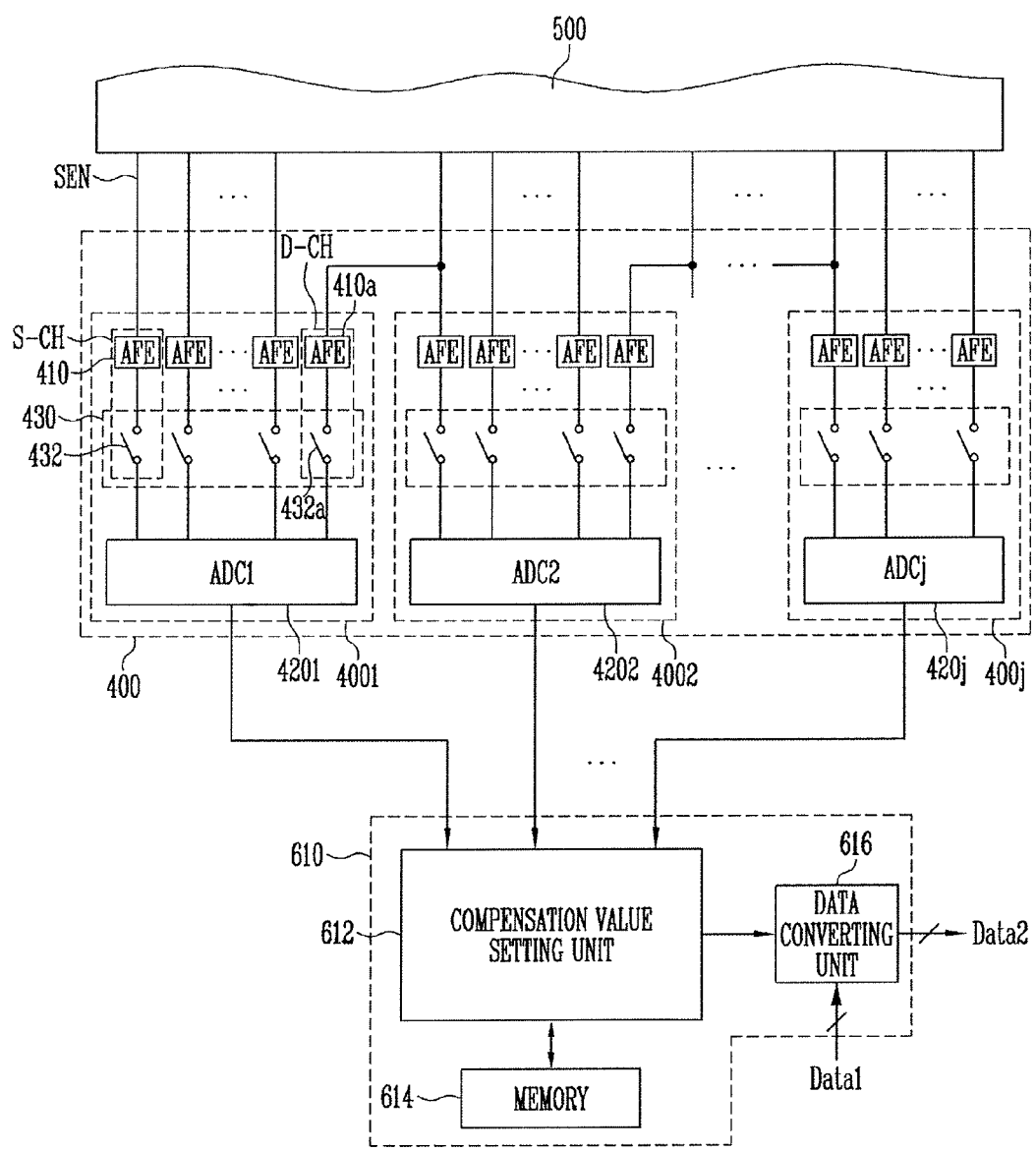
FIG. 5 illustrates a display device, in particular, a sensing circuit and a compensating unit according to an embodiment of the present inventive concept.

FIG. 5 illustrates a display device, in particular, having a sensing circuit and a compensating unit according to an embodiment of the present inventive concept.

Referring to FIG. 5, the sensing circuit 400 according to the embodiment of the present inventive concept may include first through jth (j is a natural number of not less than 2) sensing ICs 400₁ through 400j each including at least one ADC 420k (k is a natural number of not less than 1 and not more than j). The sensing ICs 400₁ through 400j may be implemented by readout ICs that extract the characteristic information of the pixels 510.

According to the embodiment, the kth sensing IC 400k may include the plurality of AFEs 410 respectively connected to the plurality of sensing lines SEN, the ADC 420k connected to the output ends of the AFEs 410, and a switching unit 430 including a plurality of switching elements 432 and 432a connected between the AFEs 410 and the ADC 420k. The AFE 410 and the switching element 432 connected to each of the sensing lines SEN assigned to the kth sensing IC 400k form each sensing channel S-CH provided in the kth sensing IC 400k. For example, the kth sensing IC 400k includes the plurality of sensing channels S-CH formed of the plurality of AFEs 410 respectively connected to the plurality of sensing lines SEN assigned to the kth sensing IC 400k and the plurality of switching elements 432 connected between the AFEs 410 and the kth ADC 400k.

According to the embodiment of the present inventive concept, at least two sensing ICs among the sensing ICs 400₁ through 400j may be commonly connected to at least one sensing line SEN. Therefore, at least two ADCs among a plurality of ADCs 420₁ through 420j may be commonly connected to the at least one sensing line SEN. According to the embodiment, the at least two ADCs may be commonly connected to the at least one sensing line SEN through a wiring line on the display panel 500, or may be commonly connected to the at least one sensing line SEN through the outside of the display panel 500, for example, a circuit board on which the sensing ICs 400₁ through 400j and/or the compensating unit 610 are mounted. A person of ordinary skill in the art understands there are other ways the at least two ADCs may be commonly connected to the at least one sensing line SEN that are within the inventive concept.

According to the embodiment, two adjacent sensing ICs may be commonly connected to the same sensing line SEN. For example, the kth sensing IC 400k and the (k+1)th sensing IC 400k+1 may be commonly connected to the first sensing line SEN assigned to the (k+1)th sensing IC 400k+1.

For this purpose, the kth sensing IC 400k further includes at least one dummy channel D-CH connected to at least one sensing line among the sensing lines connected to the (k+1)th sensing IC 400k+1, for example, the first sensing line SEN of the (k+1)th sensing IC 400k+1. On the other hand, as shown in FIG. 5, according to the embodiment, the final sensing IC, for example, the jth sensing IC 400j may not include the dummy channel D-CH. For example, whether the jth sensing IC 400j includes the dummy channel D-CH may vary in accordance with an embodiment.

According to the embodiment, the dummy channel D-CH of the kth sensing IC 400k may include a dummy AFE 410a connected between at least one sensing line SEN connected to the (k+1)th sensing IC 400k+1 and the kth ADC 400k and a dummy switching element 432a connected between the dummy AFE 410a and the kth ADC 400k. The dummy channel D-CH may be used for setting the correction value in the sensing period.

For example, in setting a correction value for the kth sensing IC 400k and/or the (k+1)th sensing IC 400k+1 to correct output deviation between the kth sensing IC 400k and the (k+1)th sensing IC 400k+1, the characteristic information of the pixels 510 connected to the sensing line SEN may be sequentially extracted through the sensing line SEN commonly connected to the kth sensing IC 400k and the (k+1)th sensing IC 400k+1 and the extracted characteristic information may be supplied to the kth sensing IC 400k and the (k+1)th sensing IC 400k+1. Output values of the kth sensing IC 400k and the (k+1)th sensing IC 400k+1 for the characteristic information extracted by the same pixel 510 may be compared by comparing the output values of the kth sensing IC 400k and the (k+1)th sensing IC 400k+1. Therefore, the output deviation between the kth sensing IC 400k and the (k+1)th sensing IC 400k+1 may be calculated.

At this time, since the characteristic information of the plurality of pixels 510 connected to the sensing line SEN is extracted through the sensing line SEN commonly connected to the kth sensing IC 400k and the (k+1)th sensing IC 400k+1, digital output values (for example, digital codes respectively corresponding to analog voltages) of the kth sensing IC 400k and the (k+1)th sensing IC 400k+1 for the analog voltages extracted from the plurality of pixels 510 are compared to set a correction value for each of the analog voltages.

The correction value may be set to compensate for the output deviation between the kth sensing IC 400k and the (k+1)th sensing IC 400k+1. For example, the correction value for the (k+1)th sensing IC 400k+1 may be set so that the output value of the (k+1)th sensing IC 400k+1 is equal to the output value of the kth sensing IC 400k for each of the analog voltages.

In addition, when the sensing circuit 400 includes at least three ADCs 420₁ through 420j, the correction value for the (k+1)th sensing IC 400k+1 may be sequentially set by sequentially comparing the output values of the two ADCs 420k and 420k+1.

For example, at least a part of the sensing period is assigned as a correction value setting period and, in a first period of the correction value setting period, the characteristic information of the pixels 510 commonly connected to the first ADC 420₁ and the second ADC 420₂ may be sensed. After supplying the sensed characteristic information to the first ADC 420₁ and the second ADC 420₂, the output values of the first ADC 420₁ and the second ADC 420₂ may be compared. In response to the comparison result, for example, a correction value for an output value of the second ADC 400₂ may be set so that the output value of the second ADC 420₂ is equal to an output value of the first ADC 420₁, so that a uniformity of brightness displayed by the pixels for the same value may be achieved. According to the embodiment, correction data for the plurality of voltages sensed by the pixels 510 in the first period may be included in the correction value for the output value of the second ADC 420₂.

In a second period of the correction value setting period, the characteristic information of the pixels 510 commonly connected to the second ADC 4202 and the third ADC 4203 may be sensed. According to an embodiment, the second period may be assigned to the same sensing period as the sensing period to which the first period is assigned, or may be assigned to a sensing period different from the sensing period to which the first period is assigned. For example, the first period and the second period may be sequentially arranged in the correction value setting period assigned to a predetermined sensing period or only the first period may be arranged in the correction value setting period assigned to the first sensing period and only the second period may be arranged in the correction value setting period assigned to the second sensing period after the first sensing period.

All the characteristic information sensed in the second period may be supplied to the second ADC 4202 and the third ADC 4203. Output values of the second ADC 4202 and the third ADC 4203 corresponding to the characteristic information sensed in the second period may be compared. At this time, the output value of the second ADC 4202 compared with the output value of the third ADC 4203 may be a value obtained by reflecting the correction value set in the first period. A correction value for the output value of the third ADC 4203 may be set so that the output value of the third ADC 4203 is equal to the output value of the second ADC 4202 in response to the comparison result.

Correction values for output values of the second through jth ADCs 4202 through 420j may be set so that output deviations among the first through jth ADCs 4201 through 420j are compensated for by repeating the above-described method. For example, the output values of the kth ADC 420k and the (k+1)th ADC 420k+1 may be compared while increasing the value k until the correction values for the output values of the second through jth ADCs 4202 through 420j are set in accordance with the output value of the first ADC 4201. Then, in response to the comparison result, a process of setting the correction value of the (k+1)th ADC 420k+1 may be repeatedly performed.

According to the embodiment, operation of setting the correction value by comparing the output values of the first through jth ADCs 4201 through 420j may be performed by the compensating unit 610. For example, the compensating unit 610 compares at least two sensing data extracted through the at least one sensing line SEN and converted by the at least two different ADCs 420k and 420k+1 and may set the correction value in response to the comparison result. The compensating unit 610 may set the compensation value for each of the pixels 510 by using the sensing data of the pixels 510 output from the first through jth ADCs 4201 through 420j and the correction value of the ADC 420k corresponding to the pixels 510. The compensating unit 610 may then convert the first data Data1 into the second data Data2 by using the set compensation value. The compensating unit 610 may include a compensation value setting unit 612, a memory 614, and a data converting unit 616 for converting the first data Data1 into the second data Data2.

According to the embodiment, the compensation value setting unit 612 sets the correction value by comparing the output values of the plurality of ADCs 420k and 420k+1 in the correction value setting period and may store the correction value in the memory 614. In addition, the compensation value setting unit 612 may update the correction value by comparing the output values of the plurality of ADCs 420k and 420k+1 every predetermined correction value setting period. The compensation value setting unit 612 may set the compensation value for each of the pixels 510 based on the correction value to the sensing data extracted from the pixels 510 and may be converted in every sensing period. The set compensation value may be stored in the memory 614.

The memory 614 may store the sensing data supplied through the sensing circuit 400 in the sensing period and the compensation value set by the compensation value setting unit 612.

The data converting unit 616 converts the first data Data1 input from the outside (e.g. an external source) into the second data Data2 by using the compensation value set by the compensation value setting unit 612 and outputs the second data Data2. The second data Data2 output from the data converting unit 616 is input to the data driver 200 and is used for generating the data signals.

As described above, according to the embodiment of the present inventive concept, the first data Data1 is converted into the second data Data2 by using the sensing data to which the characteristic information of the pixels 510 extracted in the predetermined sensing period are applied to the first data Data1 and the correction value for compensating for the output deviations among the plurality of sensing ICs 4001 through 400j, in particular, the plurality of ADCs 4201 through 420j used for generating the sensing data. The data signals corresponding to the second data Data2 are generated and are supplied to the pixels 510 in the driving period. Therefore, the characteristic deviations among the pixels 510 are effectively compensated for so that an image with uniform picture quality may be displayed on the display panel 500.

Figure 6:
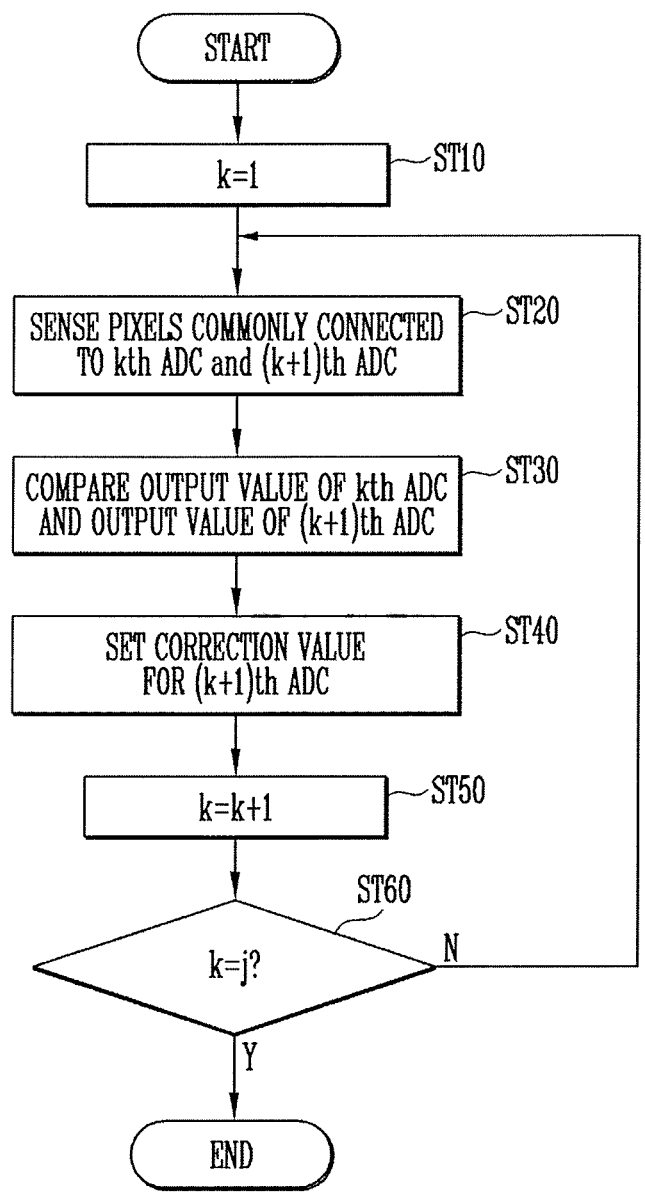
FIG. 6 illustrates a method of setting a correction value according to an embodiment of the present inventive concept.

FIG. 6 is a flowchart illustrating a method of setting a correction value according to an embodiment of the present inventive concept.

Referring to FIG. 6, the output values of the two sensing ICs 400k and 400k+1, in particular, the ADCs 420k and 420k+1 included in the sensing ICs 400k and 400k+1 are sequentially compared and the correction value is sequentially set so that the output deviations between the ADCs 420k and 420k+1 are compensated for so that the output deviations among the plurality of sensing ICs 4001 through 400j included in the sensing circuit 400 may be compensated for to provide a uniform display of the image data.

With reference to FIG. 6, the value k is set as 1 and the characteristic information of the pixels 510 commonly connected to the kth ADC 420k and the (k+1)th ADC 420k+1 are sensed. Then, the analog voltages corresponding to the characteristic information of the sensed pixels 510 are supplied to the kth ADC 420k and the (k+1)th ADC 420k+1. For example, the characteristic information of the pixels 510 on the vertical line connected to the sensing line SEN shared by the kth IC 400k and the (k+1)th IC 400k+1 is sensed in accordance with the set value k and the sensed characteristic information is supplied to the kth ADC 420k and the (k+1)th ADC 420k+1 (operations ST10 and ST20).

Then at ST30 the process illustrated in FIG. 6 includes comparing the output values of the kth ADC 420k and the (k+1)th ADC 420k+1 corresponding to the characteristic information of the pixels 510 connected to the corresponding sensing line SEN, and at ST40 the correction value for the output value of the (k+1)th ADC 420k+1 is set in response to the comparison result. For example, when the same analog voltage is input to the kth ADC 420k and the (k+1)th ADC 420k+1, the correction value for the output value of the (k+1)th ADC 420k+1 may be set in accordance with the output value of the kth ADC 420k so that the kth ADC 420k and the (k+1)th ADC 420k+1 output the same digital code (operations ST30 and ST40). By setting the correction value so the ADCs output the same digital code for a same analog voltage input, the ADCs do not introduce an unintended variation to the image that will be displayed by the pixels.

With continued reference to FIG. 6, at ST50, after increasing the value k by 1, the process returns to the operation ST20. Then, the above-described process is repeated until the correction value for the output value of the jth ADC 420*j* provided in the final IC, for example, the jth IC 400*j* is set. For example, the process of comparing the output values of the kth ADC 420*k* and the (k+1)th ADC 420*k*+1 while increasing the value k until the correction value for the remaining output values of the ADCs 4202 through 420*j* is set in accordance with the output value of the first ADC 4201 may be repeatedly performed (operations ST50 and ST60).

According to the embodiment, the above-described correction value setting process is performed before extracting the deterioration information of all the pixels 510 or may be performed only in a predetermined sensing period or only when in response to a user selection. For example, the correction value setting process may be performed in a predetermined period assigned to the sensing period every sensing period. For example, the correction value setting process may be performed before extracting the characteristic information of the pixels 510 every sensing period or, rather than setting the correction value every sensing period, the correction value setting process may be performed in a predetermined sensing period or whenever a selection signal of a user is input so that the correction value may be intermittently updated.

Figure 7:
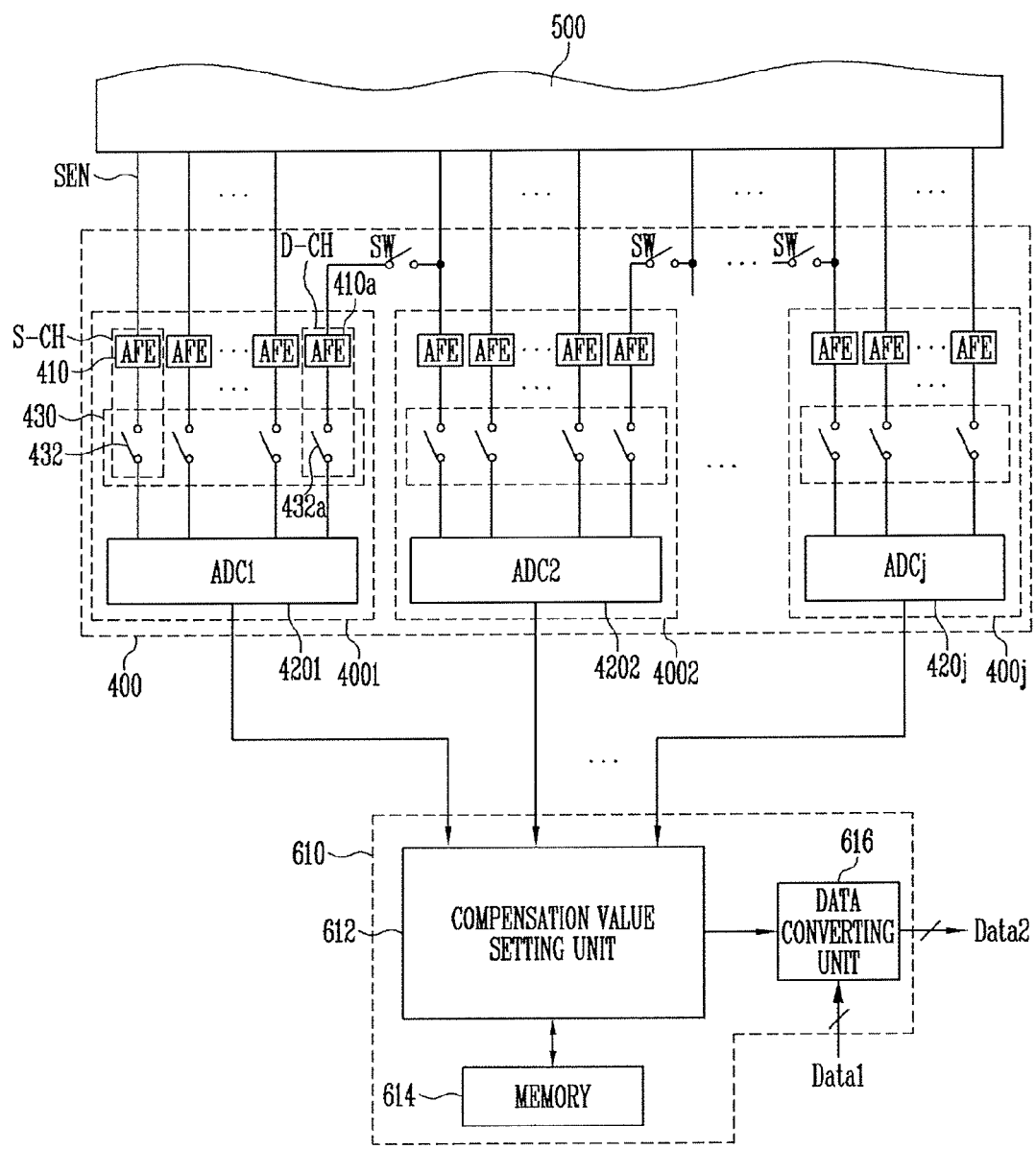
FIG. 7 illustrates a display device according to an embodiment of the present inventive concept.

FIG. 7 illustrates a display device according to an embodiment of the present inventive concept. In FIG. 7, the same elements as those of FIG. 5 are denoted by the same reference numerals and detailed description thereof will not be given.

Referring to FIG. 7, the display device according to the embodiment of the present inventive concept further includes at least one switching element SW connected between the sensing line SEN commonly connected to the kth ADC 420*k* and the (k+1)th ADC 420*k*+1 and the dummy channel D-CH of the kth ADC 420*k*. According to the embodiment, the switching element SW is selectively turned on when the kth ADC 420*k* outputs a comparison value to compensate for the output deviation between the ADCs 420*k* and 420*k*+1 connected to the corresponding sensing line SEN and may maintain an off state in the remaining period. Therefore, in the sensing period in which the deterioration information of the pixels 510 is extracted, it is possible to prevent the dummy channel D-CH from affecting capacitance of the corresponding sensing line SEN.

On the other hand, when the correction value is set by using the display device according to the above-described embodiment, at an initial stage of the correction value setting process, the sensing line SEN selected among the sensing lines SEN is commonly connected to the ADCs 420*k* and 420*k*+1 connected to the sensing line SEN. Then, the process of setting the correction value by comparing the output characteristics of the ADCs 420*k* and 420*k*+1 may be performed in the same manner as the embodiment described with reference to FIGS. 5 and 6.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, the features, characteristics, and/ or elements described in connection with a particular embodiment may be used individually or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A display device comprising:
 a plurality of pixels;
 a plurality of sensing lines respectively connected to groups of the plurality of pixels;
 a sensing circuit configured to extract characteristic information of the plurality of pixels through the plurality of sensing lines, the sensing circuit including a plurality of analog-to-digital converters (ADCs) configured to convert the extracted characteristic information into digital sensing data and to output the digital sensing data;
 a compensating circuit configured to compare values of the digital sensing data output by the plurality of ADCs, to set a correction value, and to convert a first data into a second data to be displayed by the display device based on the digital sensing data and the correction value; and
 a data driver configured to generate data signals corresponding to the second data and to output the data signals to the plurality of pixels,
 wherein, when at least some of the plurality of ADCs convert a same voltage value of the characteristic information into different digital codes, the correction value is set to compensate for output deviations among the ADCs.

2. The display device of claim 1, wherein the characteristic information of the plurality of pixels extracted by the sensing circuit includes one or more of:
 threshold voltages, carrier mobilities, deterioration information of driving transistors of the respective pixels or of organic light emitting diodes (OLED) included in the respective pixels.

3. The display device of claim 1, wherein at least two ADCs among the plurality of ADCs are commonly connected to at least one sensing line of the plurality of sensing lines.

4. The display device of claim 3, wherein the compensating circuit is configured to compare values of at least two digital sensing data extracted through the at least one sensing line and converted by the at least two ADCs and set the correction value in response to a comparison result.

5. The display device of claim 1, wherein a kth (k is a natural number) ADC among the plurality of ADCs is connected to a dummy channel connected to at least one sensing line among sensing lines connected to a (k+1)th ADC.

6. The display device of claim 5, wherein the dummy channel comprises an analog front end (AFE) connected between the at least one sensing line connected to the (k+1)th ADC and the kth ADC and a switching element connected between the AFE and the kth ADC.

7. The display device of claim 5, further comprising at least one switching element connected between the at least one sensing line commonly connected to the kth ADC and the (k+1)th ADC and the dummy channel.

8. The display device of claim 5, wherein the kth ADC is further connected to a plurality of sensing channels including a plurality of analog front ends (AFEs) respectively connected to a plurality of sensing lines assigned to a sensing integrated circuit (IC) including the kth ADC and a plurality of switching elements connected between the AFEs and the kth ADC.

9. The display device of claim 1, wherein the compensating circuit comprises:
a compensating value setting unit configured to set a compensation value for each of the pixels based on the digital sensing data and the correction value; and
a data converting unit configured to convert the first data into the second data by applying the compensation value to the first data.

10. A method of driving a display device, the method comprising:
extracting, during a sensing period, characteristic information of pixels of the display device through a plurality of sensing lines, converting the characteristic information into digital sensing data, and setting a compensation value to compensate for characteristic deviations among the pixels based on the digital sensing data; and
converting, during a driving period, a first data input from an external source into a second data by using the compensation value, and generating data signals corresponding to the second data;
wherein the setting of the compensation value comprises:
setting a correction value by comparing values of the digital sensing data output by a plurality of analog-to-digital converters (ADCs) connected to the plurality of sensing lines, the correction value being set so to compensate for output deviations among the ADCs for a first voltage value of the characteristic information when at least some of the plurality of ADCs convert a same first voltage value into different digital codes; and
setting the compensation value based on the correction value.

11. The method of claim 10, wherein the extracting of the characteristic information of the pixels includes extracting one or more of:
threshold voltages, carrier mobilities, deterioration information of driving transistors of the respective pixels or of organic light emitting diodes (OLED) included in the respective pixels.

12. The method of claim 10, wherein the setting of the correction value comprises:
comparing output values of a kth (k is a natural number) ADC and a (k+1)th ADC among the plurality of ADCs; and
setting a correction value for the output value of the (k+1)th ADC so that the output value of the (k+1)th ADC is corrected in accordance with an output value of the kth ADC.

13. The method of claim 12, wherein, in the setting of the correction value, the comparing the output value of the kth ADC and the output value of the (k+1)th ADC is repeatedly performed while increasing a value k until a correction value for output values of remaining ADCs is set in accordance with an output value of a first ADC among the plurality of ADCs.

14. The method of claim 10, wherein the setting of the correction value is performed in a predetermined period assigned to the sensing period every sensing period.

15. The method of claim 10, wherein the setting of the correction value is performed in a predetermined sensing period or in response to an input of a user selection signal.

16. The method of claim 10, wherein the setting of the correction value comprises:
commonly connecting at least one sensing line among the sensing lines to at least two ADCs;
extracting characteristic information of pixels connected to the sensing line through the at least one sensing line and supplying the extracted characteristic information to the at least two ADCs; and
comparing the digital sensing data output from the at least two ADCs in response to the characteristic information of the pixels connected to the sensing line and setting the correction value in response to a result of the comparing.

17. A display device comprising:
a display panel;
a plurality of pixels arranged within the display panel;
a plurality of scan lines and a plurality of data lines connected to the plurality of pixels;
a sensing circuit configured to extract characteristic information of the pixels, the sensing circuit including a plurality of analog-to-digital converters (ADCs) to convert the characteristic information into digital sensing data;
a compensating circuit configured to compare digital sensing values of the plurality of ADCs, to set a correction value, and convert a first data into a second data based on the digital sensing values and the correction value; and
a data driver configured to generate data signals corresponding to the second data and output the data signals to the pixels during a driving period,
wherein at least some of the plurality of data lines are connected to the sensing circuit by which the sensing circuit extracts the characteristic information of the pixels during a predetermined sensing period, and
wherein, when at least some of the plurality of ADCs convert a same voltage value of the characteristic information into different digital codes, the correction value is set to compensate for output deviations among the ADCs.

18. The display device of claim 17, wherein each of the plurality of pixels include a driving transistor and an organic light emitting diode (OLED) connected to the driving transistor, and
wherein the driving transistor controls a driving current that flows to the OLED in response to the data signals corresponding to the second data.

* * * * *